(12) United States Patent
Liu et al.

(10) Patent No.: US 12,365,977 B2
(45) Date of Patent: Jul. 22, 2025

(54) ARRAY SUBSTRATE, DISPLAY PANEL AND DISPLAY APPARAT

(71) Applicant: KUNSHAN GO-VISIONOX OPTO-ELECTRONICS CO., LTD., Kunshan (CN)

(72) Inventors: Mingxing Liu, Kunshan (CN); Chao Chi Peng, Kunshan (CN); Shuaiyan Gan, Kunshan (CN); Zhiyuan Zhang, Kunshan (CN); Weili Li, Kunshan (CN)

(73) Assignee: KUNSHAN GO-VISION OPTO-ELECTRONICS CO., LTD., Kunshan (CN)

( * ) Notice: Subject to any disclaimer, the term of this patent is extended or adjusted under 35 U.S.C. 154(b) by 662 days.

(21) Appl. No.: 17/464,701

(22) Filed: Sep. 2, 2021

(65) Prior Publication Data

US 2021/0399255 A1    Dec. 23, 2021

Related U.S. Application Data

(63) Continuation of application No. PCT/CN2020/080822, filed on Mar. 24, 2020.

(30) Foreign Application Priority Data

Jul. 24, 2019    (CN) .......................... 201921174318.6

(51) Int. Cl.
*H10K 50/816*    (2023.01)
*H10K 50/80*    (2023.01)
(Continued)

(52) U.S. Cl.
CPC ........... *H10K 50/816* (2023.02); *H10K 50/82* (2023.02); *H10K 50/84* (2023.02); *H10K 50/868* (2023.02); *H10K 59/60* (2023.02)

(58) Field of Classification Search
CPC ...... H10K 50/816; H10K 50/82; H10K 50/84; H10K 50/868; H10K 59/60; H10K 59/87;
(Continued)

(56) References Cited

U.S. PATENT DOCUMENTS

2016/0203742 A1    7/2016  Peterson et al.
2020/0194730 A1*   6/2020  Park .................... H10K 50/822
(Continued)

FOREIGN PATENT DOCUMENTS

CN    107236927 A    10/2017
CN    107946341 A    4/2018
(Continued)

OTHER PUBLICATIONS

International Search Report for Application No. PCT/CN2020/080822.

*Primary Examiner* — Joseph C. Nicely
*Assistant Examiner* — Alvin L Lee
(74) *Attorney, Agent, or Firm* — KILPATRICK TOWNSEND & STOCKTON LLP

(57) ABSTRACT

Provided are an array substrate, a display panel and a display apparatus. The array substrate includes a main display region, at least one secondary display region adjacent to the main display region, and a transition display region adjacent to the at least one secondary display region and the main display region.

15 Claims, 4 Drawing Sheets

(51) Int. Cl.
*H10K 50/82* (2023.01)
*H10K 50/84* (2023.01)
*H10K 59/60* (2023.01)

(58) Field of Classification Search
CPC ......... H10K 59/80517; H10K 59/8052; H10K 71/166; H10K 2102/351; H10K 71/60; H10K 50/86; H10K 50/813; H10K 50/822; H10K 50/828; H10K 59/40; H10K 59/65; H10K 59/10; C23C 14/042; G09G 3/3208–3225
See application file for complete search history.

(56) References Cited

U.S. PATENT DOCUMENTS

| | | | |
|---|---|---|---|
| 2020/0212368 A1* | 7/2020 | Tang | H10K 59/121 |
| 2020/0303472 A1* | 9/2020 | Lou | H10K 59/131 |
| 2020/0328373 A1* | 10/2020 | Huang | H10K 50/868 |
| 2020/0411610 A1* | 12/2020 | Zhang | H10K 59/131 |

FOREIGN PATENT DOCUMENTS

| | | | |
|---|---|---|---|
| CN | 108376696 A | | 8/2018 |
| CN | 108866476 A | | 11/2018 |
| CN | 208271472 U | | 12/2018 |
| CN | 109371361 A | | 2/2019 |
| CN | 109920931 A | | 6/2019 |
| CN | 110018610 A | * | 7/2019 |
| CN | 210167360 U | | 3/2020 |

* cited by examiner

ARRAY SUBSTRATE, DISPLAY PANEL AND DISPLAY APPARAT

CROSS-REFERENCES TO RELATED APPLICATIONS

This application is a continuation application of International Patent Application No. PCT/CN2020/080822 with an international filing date of Mar. 24, 2020, which claims priority benefits to Chinese Patent Application No. 201921174318.6, filed on Jul. 24, 2019. The contents of both of the aforementioned applications are incorporated herein by reference.

TECHNICAL FIELD

The present application relates to the field of display technologies, and more particularly to an array substrate, a display panel and a display apparatus.

BACKGROUND OF THE INVENTION

With the rapid development of display terminals, users have increasingly high demands for the screen ratio. As components such as cameras, sensors, and receivers need to be installed at the top of the screen, a part area at the top of the screen is usually reserved for installing the above components, which affects the overall consistency of the screen.

At the same time, opening parts need to be shielded before evaporation is carried out. The mask for evaporation needs to be provided with a shielding part for covering the opening parts. The opening parts are usually not next to the edge of the display screen, but are usually spaced at a certain distance from the edge of the display screen. Therefore, the shielding part is connected to a frame of the mask via a cantilever (supporting bar). The existence of the cantilever causes covering of the normal display region during the evaporation process, and evaporation materials cannot be formed in the area covered by the cantilever, thus forming black stripes, which affects the normal display effect of the display screen.

The facts that the above functional area and the covered area by the cantilever of the mask cannot provide normal and effective display function finally affect the overall consistency of the screen, and as a result a true full screen cannot be realized.

BRIEF SUMMARY OF THE INVENTION

Therefore, the technical problem to be solved by the present application is to provide an array substrate, a display panel and a display apparatus that can realize a comprehensive display, in order to overcome the defect that the functional area and the covered area by the cantilever of the mask cannot provide normal and effective display function.

According to one aspect, the present application provides an array substrate, which comprises: a main display region; at least one secondary display region, adjacent to the main display region; and a transition display region, adjacent to the at least one secondary display region and the main display region, wherein a third thickness of a first electrode arranged in the at least one secondary display region is smaller than a second thickness of the first electrode disposed in the transition display region, and the second thickness is less than or equal to a first thickness of the first electrode disposed in the main display region.

According to another aspect, the present application provides a display panel, which comprises: the above-mentioned array substrate; an encapsulation layer, encapsulated on a side of the array substrate away from the base substrate and comprising a polarizer at least covering the main display region; and a photosensitive component, arranged under the array substrate disposed in the secondary display region, wherein at least part of the secondary display region is surrounded by the main display region.

According to another aspect, the present application provides a display apparatus comprising: a main body, having a component area; and the above-mentioned display panel, covering the main body; wherein, the component area is located below the array substrate disposed in the secondary display region, and the component area comprises a photosensitive component that emits or collects lights via the secondary display region; and wherein, the photosensitive component comprises at least one selected from a camera, a light sensor, and a light emitter.

The technical solutions of the present application have the following advantages:

The array substrate provided in the present application comprises a main display region; at least one secondary display region, adjacent to the main display region; and a transition display region, adjacent to the at least one secondary display region and the main display region, wherein a third thickness of a first electrode arranged in the at least one secondary display region is smaller than a second thickness of the first electrode disposed in the transition display region, and the second thickness is less than or equal to a first thickness of the first electrode disposed in the main display region.

In the present application, the light transmittance of the secondary display region is increased by reducing the third thickness of the first electrode arranged in the at least one secondary display region, so that a light transmittance of the at least one secondary display region is greater than a light transmittance of the main display region and the transition display region. The first electrode arranged in the at least one secondary display region can be set thinner as long as its thickness meets the basic requirements of display luminescence, thereby not only ensuring the display function of the at least one secondary display region, but also ensuring a higher light transmittance when not carrying out display, which facilitates the normal use of functional elements located below the at least one secondary display region.

In the display apparatus provided by the present application, a thickness of a second electrode arranged in the at least one secondary display region is less than or equal to a thickness of the second electrode disposed in the main display region, and/or the thickness of the second electrode arranged in the at least one secondary display region is less than or equal to the thickness of the second electrode disposed in the transition display region. The light transmittance of the at least one secondary display region is further increased by reducing the third thickness of the at least one second electrode.

DETAILED DESCRIPTION OF THE INVENTION

In addition, the technical features involved in different embodiments of the present application described below can be combined with each other as long as they do not conflict with each other.

Embodiment 1

This present application discloses a display apparatus, comprising a main body and a display panel, wherein the main body has a component area, and the display panel covers the main body. The display panel comprises an array substrate and an encapsulation layer encapsulated on a side of the array substrate away from a base substrate.

Figure 1:
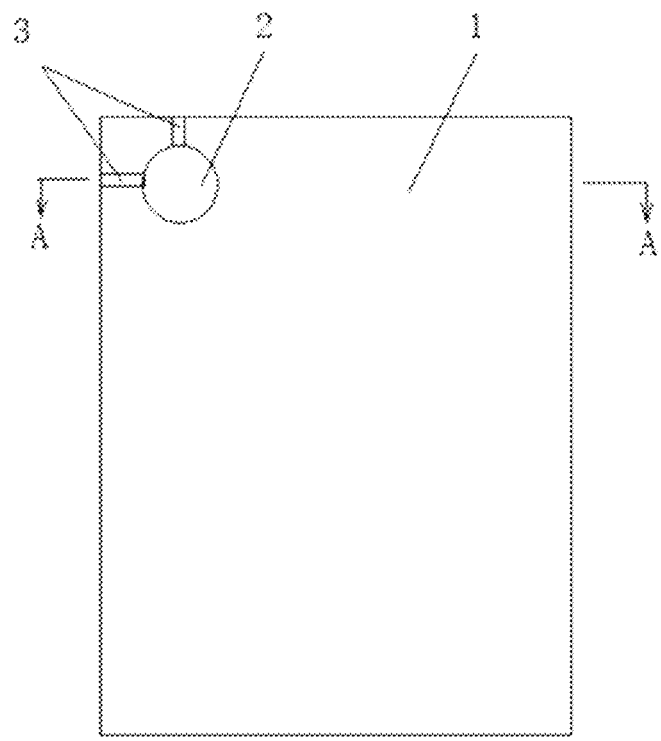
FIG. 1 is a schematic structural diagram of a display apparatus in a first embodiment of the present application.
Figure 2:
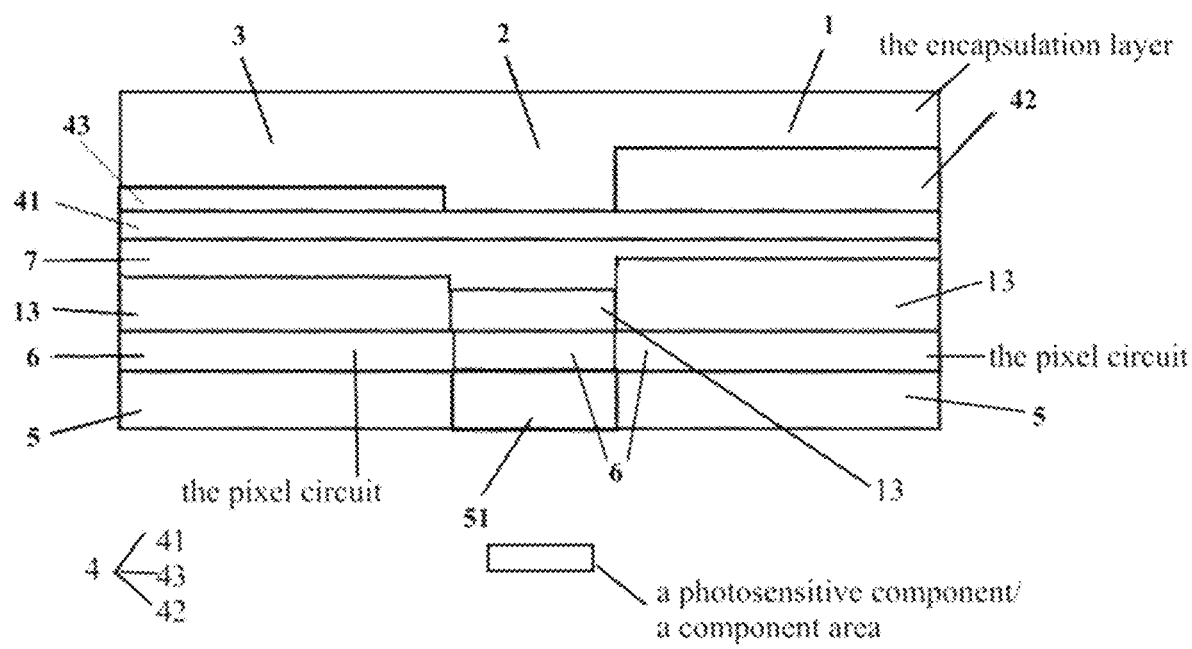
FIG. 2 is a cross-sectional view of A-A as shown in FIG. 1.

As shown in FIGS. 1 and 2, the array substrate comprises a main display region 1, at least one secondary display region 2 and a transition display region 3, wherein the main display region 1 is adjacent to the secondary display region 2, and the transition display region 3 is adjacent to the at least one secondary display region 2 and the main display region 1. The main display region 1, the at least one secondary display region 2 and the transition display region 3 are all capable of displaying a static or dynamic image. At least a portion of the at least one secondary display region 2 is surrounded by the main display region 1. A light transmittance of the at least one secondary display region 2 is greater than a light transmittance of the transition display region 3 and the main display region 1.

Wherein, the component area is located below the array substrate disposed in the secondary display region 2, and the component area comprises a photosensitive component that emits or collects lights via the secondary display region. In an alternative embodiment, the photosensitive component comprises at least one selected from a camera, a light sensor, and a light emitter.

The encapsulation layer comprises a polarizer which covers the main display region 1 or covers the main display region 1 and the at least one secondary display region 2 or covers the main display region 1, the at least one secondary display region 2 and the transition display region 3. In order to ensure the normal display function of the array substrate and at the same time to ensure the normal operation of the photosensitive component arranged below the array substrate, the position to be covered by the polarizer can be set according to the requirements of the specific product. This is only an example, and does not limit the application in any way.

The array substrate further comprises a base substrate and a pixel circuit arranged on the base substrate, wherein the pixel circuit electrically connected with the first electrode disposed in the secondary display region 2 is arranged in the main display region 1 or in the transition display region 3 in order to increase the light transmittance of the secondary display region, so that the photosensitive component, such as a camera, arranged below the secondary display region works normally.

In the present embodiment, a third thickness of a first electrode arranged in the at least one secondary display region 2 is smaller than a second thickness of the first electrode disposed in the transition display region 3 and the second thickness is less than or equal to a first thickness of the first electrode disposed in the main display region. The first electrode in the main display region 1, the first electrode in the transition display region 3, and the first electrode in the at least one secondary display region 2 are connected to form a planar electrode. The first electrode in this embodiment refers to a cathode.

In the present application, the light transmittance of the at least one secondary display region 2 is increased by reducing the third thickness of the first electrode in the at least one secondary display region 2, so that a light transmittance of the at least one secondary display region 2 is greater than a light transmittance of the main display region 1 and the transition display region 3. The at least one secondary display region having a higher light transmittance allows normal use of the photosensitive component arranged below the at least one secondary display region when there is a need to use the photosensitive component, and the at least one secondary display region can realize the display function when the display function is required.

In the present embodiment, a first thickness of the cathode in the main display region is greater than a second thickness of the cathode in the transition display region 3, and the second thickness of the cathode is greater than a third thickness of the cathode in the secondary display region 2. The thickness of the first electrode, i.e. the cathode layer, is gradually increased from the secondary display region to the transition display region and to the main display region, which not only increases the light transmittance of the secondary display region, but also prevents the evaporation mask from wrinkling.

Optionally, a thickness of a second electrode arranged in the at least one secondary display region 2 is less than or equal to a thickness of the second electrode disposed in the main display region 1, and/or the thickness of the second electrode arranged in the at least one secondary display region 2 is less than or equal to the thickness of the second electrode disposed in the transition display region 3, thereby further improving the light transmittance of the secondary display region 2.

Optionally, the thickness of the second electrode arranged in the at least one secondary display region is less than the thickness of the second electrode disposed in the transition display region, and the thickness of the second electrode disposed in the transition display region is less than the thickness of the second electrode disposed in the main display region. The second electrode is an anode, and the anodes in the main display region 1, the at least one secondary display region 2 and the transition display region 3 are made of same or different materials. The anode in the present embodiment can be formed by silver evaporation. In addition, the thickness of anode 13 in the least one secondary display region 2 is smaller than the thickness of anode 13 in other areas, thereby further improving the light transmittance of the secondary display region 2.

Optionally, at least the second electrode in the least one secondary display region 2 is a transparent conductive layer, such as an indium tin oxide (ITO) layer. Of course, anode 13 can also be a transparent conductive layer covering the main display region 1, the secondary display region 2 and the transition display region 3. The transparent conductive layer has a high light transmittance due to the transparent ITO layer.

As shown in FIG. 1, the main display region 1 in the present embodiment has a rectangular shape, the secondary display region 2 has a circular shape set within the main display region 1, and the transition display region 3 has a straight bar shape, and the secondary display region 2 is connected to the boundary of main display region 1 through the transition display region 3. Of course, the secondary display region 2 is not limited to a circular shape, but can also has a rectangular shape, an elliptical shape, a rhombic shape, or a hexagonal shape, etc. The main display region 1 is not limited to a rectangular shape, but can also has a circular shape, an elliptic shape, a rhombic shape, or a hexagonal shape, etc.

Figure 3:
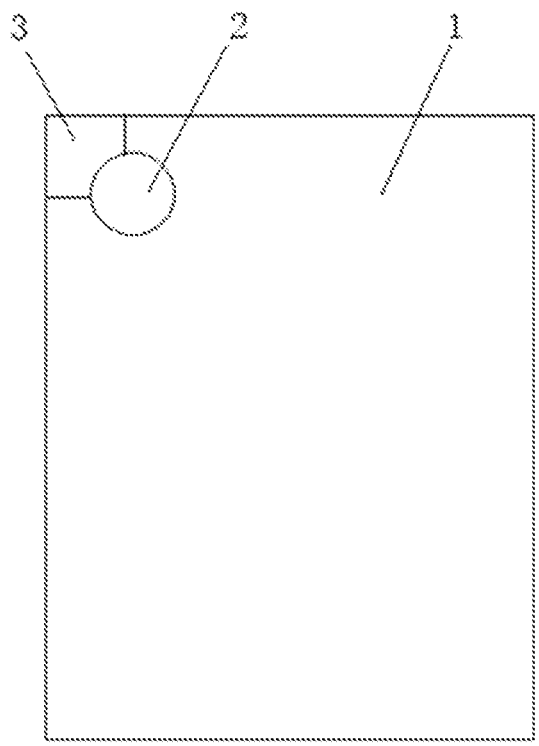
FIG. 3 is a schematic structural diagram of a display apparatus in a second embodiment of the present application.
Figure 4:
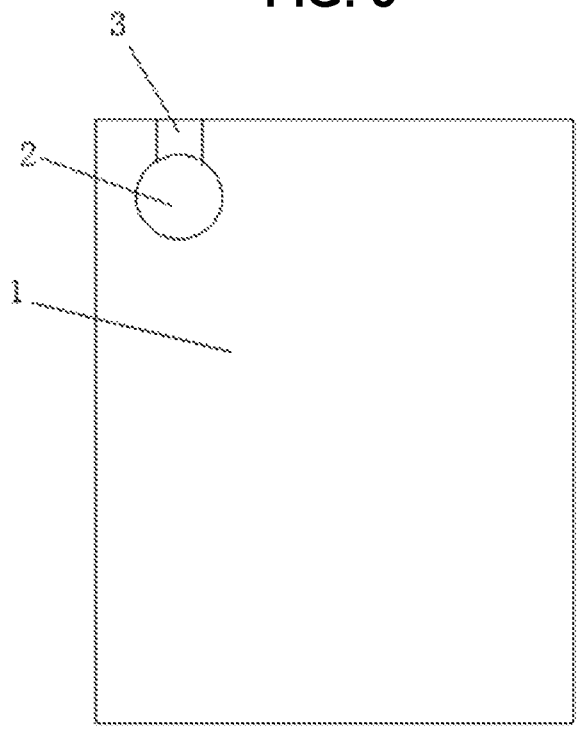
FIG. 4 is a schematic structural diagram of a display apparatus in a third embodiment of the present application.
Figure 5:
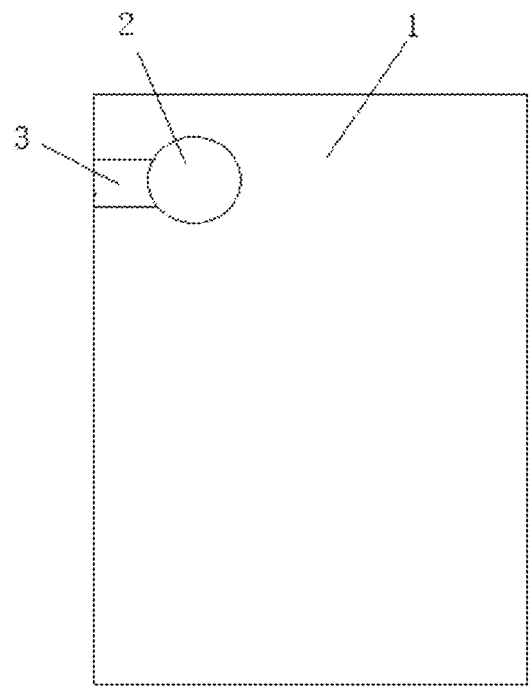
FIG. 5 is a schematic structural diagram of a display apparatus in a fourth embodiment of the present application.

Of course, the transition display region 3 can also be set as other shapes, such as a polygonal shape as shown in FIG. 3, one side of the polygon is an arc connected to the circular secondary display region 2, and other two sides are connected to two sides of the rectangular main display region 1. Or, the transition display region 3 can be a single rectangle as shown in FIG. 4 or 5, one end of the rectangular transition display region 3 is connected to the secondary display region 2, and the other end is connected to the edge of the main display region 1.

In the present embodiment, in order to ensure the light transmittance of the least one secondary display region 2, at least the base substrate area corresponding to the least one secondary display region 2 of the display apparatus is a transparent base substrate, and an entire transparent glass plate can be used as the base substrate 5; of course, non-transparent substrate can also be used. As shown in FIG. 2, the area corresponding to the least one secondary display region 2 is etched and filled with an auxiliary transparent substrate 51, and the auxiliary transparent substrate 51 is a transparent glass or a transparent organic glue.

As shown in FIG. 2, the display apparatus in the present embodiment is manufactured according to following process:

S1: Manufacturing an entire base substrate 5;
S2: Manufacturing an array substrate 6 formed on the base substrate 5;
Specially, the process comprising steps of:
Manufacturing an anode 13: When the anodes are made of different materials, it is possible to firstly form the anodes in the main display region 1 and the transition display region 3 respectively by evaporation, and then form the anode in the least one secondary display region 2 by evaporation. When the anodes are made of the same material, it is possible to firstly deposit the anode material on the entire area to reach a thickness which is identical to the thickness of the anode in the least one secondary display region 2, and then continue to deposit the anode material in the main display region 1 and the transition display region 3 respectively to increase their thickness.
Manufacturing a light emitting organic layer 7;
Manufacturing a cathode: firstly, depositing a first cathode layer 41 on the entire area to a thickness which is identical to the thickness of the cathode in the least one secondary display region 2, and then respectively depositing a second cathode layer 42 in the main display region 1 and a third cathode layer 43 in the transition display region 3 by using different common metal masks (CMM);

S3: If the base substrate 5 is a non-transparent base substrate, a portion of the base substrate 5 corresponding to the least one secondary display region 2 is removed by laser or etching, and replaced with a transparent glass substrate or a transparent organic glue.

Due to uneven thickness of the cathode of the display apparatus, the thickness of the cathode in the transition display region 3 and the least one secondary display region 2 is relatively thinner. In order to avoid affecting the normal display function, and to ensure the uniformity of the brightness in the transition display region and the least one secondary display region and ensure the normal display function, an external drive circuit can be used later to provide external optical compensation such as Demura to the display module in the transition region, thereby improving the uniformity of the overall brightness of the display apparatus and to avoid incomplete images.

Embodiment 2

This present application discloses a display apparatus, comprising a main body and a display panel, wherein the display panel comprises an array substrate and an encapsulation layer encapsulated on a side of the array substrate away from the base substrate.

The structure of the display apparatus in the present embodiment is the same as that in embodiment 1, and the structure of the display panel is also the same as that in embodiment 1. The difference between the display apparatus in the present embodiment and embodiment 1 lies in that the transition display region 3 of the display panel has a different structure.

In the present embodiment, the first electrode in the transition display region comprises a first part and a second part, the first part has a thickness greater than a thickness of the second part, and a plurality of pixel units are stacked on the first part of the first electrode. The thickness of the first part of the first electrode in the transition display region is equal to the first thickness of the first electrode in the main display region; and/or the thickness of the second part of the first electrode in the transition display region is equal to the third thickness of the first electrode in the secondary display region.

Figure 6:
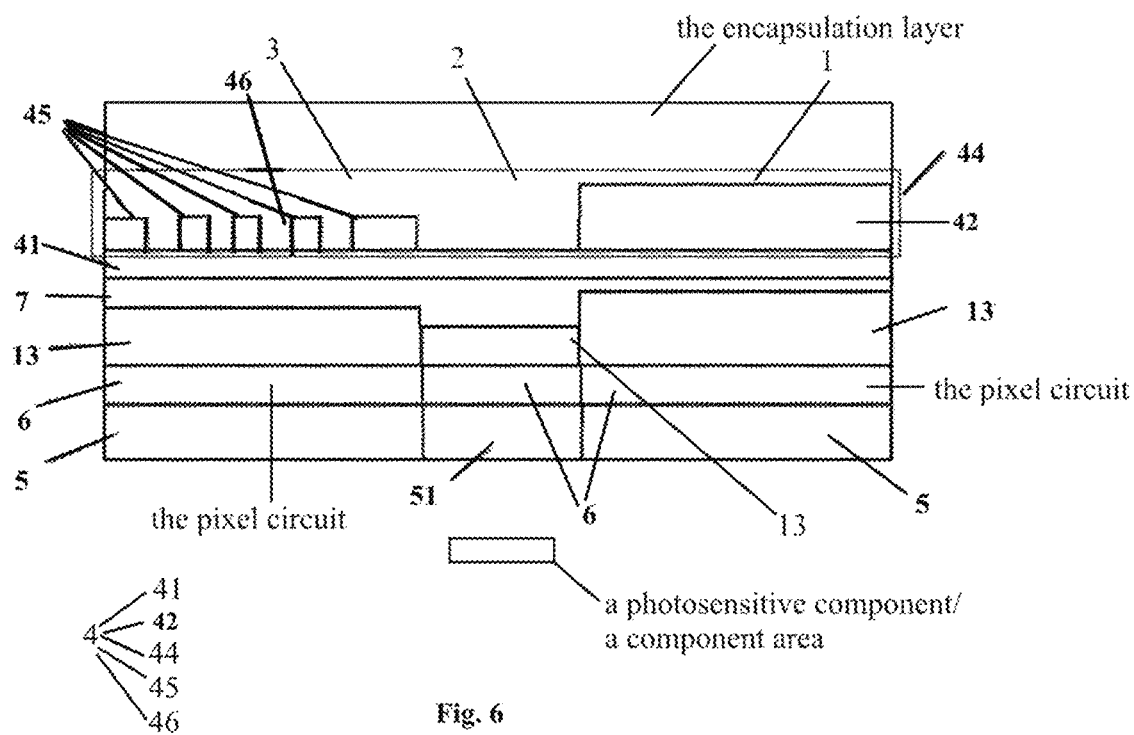
FIG. 6 is a schematic structural diagram of a display apparatus in a fifth embodiment of the present application.

In the present embodiment, the first electrode is a cathode. Referring to FIG. 6, the cathode of the transition display region 3 comprises a first cathode part 45 and a second cathode part 46, wherein the first cathode part 45 has a thickness greater than a thickness of the second cathode part 46, and a plurality of pixel units which comprise red (R) sub-pixels, green (G) sub-pixels and blue (B) sub-pixels are stacked on the first cathode part 45. Of course, other color sub-pixels, such as white (W) sub-pixels can also be comprised. It is not limited here.

In an alternative embodiment, the first cathode part 45 in the transition display region 3 has a thickness equal to the thickness of the cathode in the main display region 1. The second cathode part 46 has a thickness equal to the thickness of the cathode in the secondary display region 2.

The display apparatus in the present embodiment is manufactured according to following process:

S1: Manufacturing an entire base substrate 5;
S2: Manufacturing an array substrate 6 formed on the base substrate 5;
Specially, the process comprising steps of:
Manufacturing an anode 13: When the anodes are made of different materials, it is possible to firstly form the anodes in the main display region 1 and the transition display region 3 respectively by evaporation, and then form the anode in the at least one secondary display region 2 by evaporation. When the anode is made of the same material, it is possible to firstly deposit the anode material on the entire area to reach a thickness which is identical to the thickness of the anode in the at least one secondary display region 2, and then continue to deposit the anode material in the main display region 1 and the transition display region 3 respectively to increase their thickness.

Manufacturing a light emitting organic layer 7;

Manufacturing a cathode: firstly, depositing a first cathode layer 41 on the entire area to a thickness which is identical to the thickness of the cathode in the at least one secondary display region 2, and then respectively depositing a fourth cathode layer 44 in the main display region 1 and the transition display region 3 by using a fine metal mask (FMM).

S3: If the base substrate 5 is a non-transparent base substrate, a portion of the base substrate 5 corresponding to the at least one secondary display region 2 is removed by using laser or etching, and replaced with a transparent glass substrate or a transparent organic glue.

The main display region 1 and the transition display region 3 in the present embodiment can be simultaneously formed by evaporation through fine metal mask (FMM).

Figure 7:
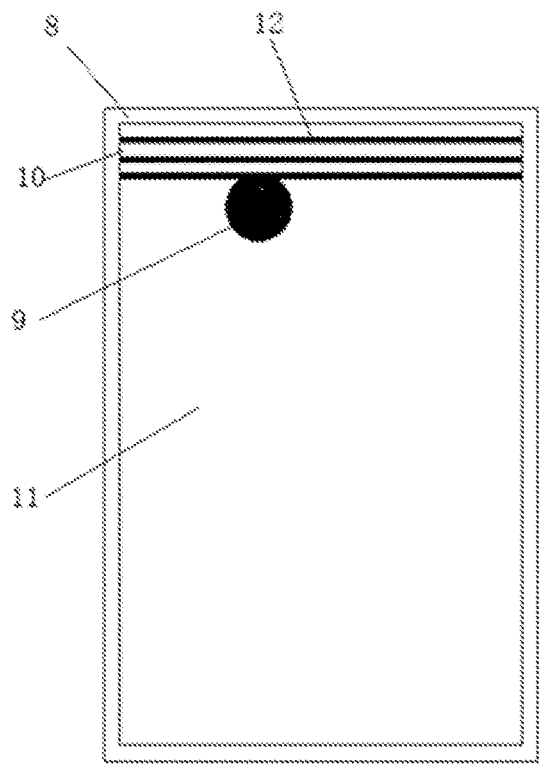
FIG. 7 is a schematic structural diagram of a mask for a cathode layer as shown in FIG. 6.
Figure 8:
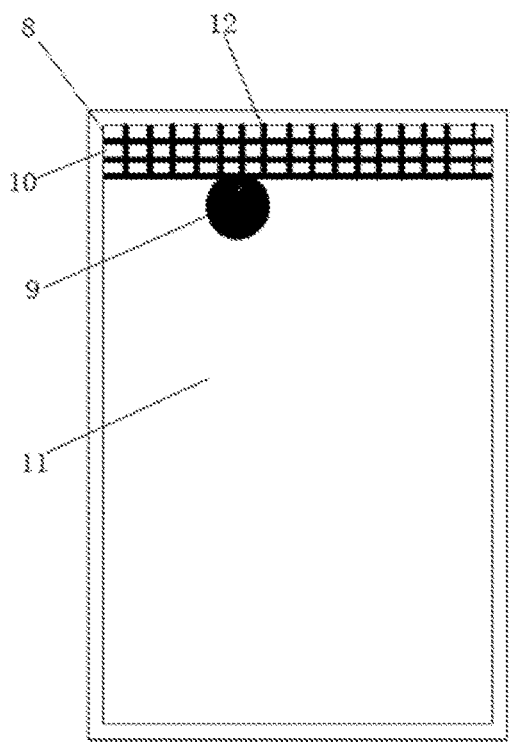
FIG. 8 is a schematic structural diagram of another mask for the cathode layer in as shown FIG. 6.

The FMM mask assembly used in the present embodiment is shown in FIGS. 7 and 8. The FMM mask assembly comprises: a mask frame 8 and a plurality of island shielding parts 9. The mask frame 8 is supported on the surface of the substrate, and the mask frame 8 is formed with an opening 11 therein and a pattern area 10 corresponding to the pixel units. The plurality of island shielding parts 9 are located within the opening 11 and connected to the adjacent pattern area 10. The mask frame 8 is a rectangular frame, and the island shielding part 9 comprises a circular shielding portion and/or a square shielding portion. Of course, the island shielding part is not limited to a rectangular or circular shape, but can also has an elliptic shape, a rhombic shape, or a hexagonal shape, etc. The mask frame is not limited to a square frame, but can also be a round frame, an elliptic frame, a rhombic frame, or a hexagonal frame, etc.

Referring to FIG. 7, the pattern area 10 comprises a plurality of shielding sub-areas 12, and the shielding sub-areas 12 are shaped in straight strips arranged in parallel at intervals. One or both ends of the straight strip-shaped shielding sub-regions 12 are respectively connected to the mask frame 8. The island shielding part 9 is connected to the edges of any one or more of the shielding sub-regions 12.

Referring to FIG. 8, the shielding sub-area 12 is arranged in a rectangular grid shape, and the island shielding part 9 is connected to the edge of the shielding sub-area 12.

With the above design of the mask assembly, deposition of the cathode layers of the display apparatus can be performed such that the transition display region 3 and the cathode 4 of the main display region 1 can be formed simultaneously through one evaporation, thus there is no need to respectively manufacture the cathode of transition display region 3 and the cathode of main display region 1 using two masks in two steps. Therefore, the process is much simpler.

Due to uneven thickness of the cathode of the display apparatus, the thickness of the cathode in the transition display region 3 and the at least one secondary display region 2 is relatively thinner. In order to avoid affecting the normal display function, and to ensure the uniformity of the brightness in the transition display region and the at least one secondary display region and ensure normal display function, an external drive circuit can be used later to provide external optical compensation such as Demura to the display module in transition region, thereby improving the uniformity of the overall brightness of the display apparatus and to avoid incomplete images.

The present application discloses an array substrate, a display panel comprising the array substrate and a display apparatus comprising the display panel. Due to the structure design of the first electrode and the second electrode in the main display region, the transition display region and the at least one secondary display region of the display panel of the display apparatus, the light transmittance of the at least one secondary display region is increased, so that the at least one secondary display region are capable of normally displaying a static or dynamic image, and at the same time, a photosensitive component is arranged below the at least one secondary display region to realize the photosensitive function, that is, to realize a truly full display.

What is claimed is:

1. An array substrate, comprises;
   a main display region;
   at least one secondary display region, adjacent to the main display region; and
   a transition display region, adjacent to the at least one secondary display region and the main display region,
   wherein a third thickness of a first electrode arranged in the at least one secondary display region is smaller than a second thickness of the first electrode disposed in the transition display region, the second thickness is less than a first thickness of the first electrode disposed in the main display region, and the thickness of the first electrode is gradually increased from the secondary display region to the transition display region and to the main display region,
   wherein, the secondary display region has the display function.

2. The array substrate of claim 1, wherein, the first electrode in the main display region, the first electrode in the transition display region, and the first electrode in the secondary display region are connected to form a planar electrode.

3. The array substrate of claim 1, wherein a thickness of a second electrode arranged in the at least one secondary display region is less than or equal to a thickness of the second electrode disposed in the main display region, and/or the thickness of the second electrode arranged in the at least one secondary display region is less than or equal to the thickness of the second electrode disposed in the transition display region.

4. The array substrate of claim 3, wherein, the thickness of the second electrode arranged in the at least one secondary display region is less than the thickness of the second electrode disposed in the transition display region, and the thickness of the second electrode disposed in the transition display region is less than the thickness of the second electrode disposed in the main display region.

5. The array substrate of claim 3, wherein, a light transmittance of the secondary display region is greater than a light transmittance of both the transition display region and the main display region, and at least the second electrode in the at least one secondary display region is a transparent conductive layer.

6. The array substrate of claim 3, wherein the second electrode is an anode, and the anodes in the main display region, the at least one secondary display region and the transition display region are made of same or different materials.

7. The array substrate of claim 6, wherein, the anode is a transparent conductive layer covering the main display region, the secondary display region and the transition display region.

8. The array substrate of claim 1, further comprising:
a base substrate; and
a pixel circuit, arranged on the base substrate;
wherein the pixel circuit electrically connected with the first electrode disposed in the secondary display region is arranged in the main display region or in the transition display region.

9. The array substrate of claim 8, wherein, at least a part of the base substrate corresponding to the at least one secondary display region is a transparent substrate.

10. The array substrate of claim 1, wherein at least part of the at least one secondary display region is surrounded by the main display region.

11. The array substrate of claim 1, wherein a light transmittance of the secondary display region is greater than a light transmittance of the transition display region and the main display region.

12. The array substrate of claim 1, wherein, the first electrode is a cathode.

13. A display panel, comprising:
an array substrate of claim 1;
an encapsulation layer, encapsulated on a side of the array substrate away from the base substrate and comprising a polarizer at least covering the main display region; and
a photosensitive component, arranged under the array substrate disposed in the secondary display region,
wherein at least part of the secondary display region is surrounded by the main display region.

14. A display apparatus, comprising:
a main body, having a component area; and
a display panel of claim 13, covering the main body;
wherein, the component area is located below the array substrate disposed in the secondary display region, and the component area comprises a photosensitive component that emits or collects lights via the secondary display region; and
wherein, the photosensitive component comprises at least one selected from a camera, a light sensor, and a light emitter.

15. The array substrate of claim 1, wherein the transition display region is a polygon, one side of the polygon is an arc connected to the secondary display region, other two sides are connected to two sides of the main display region, and the number of the transition display region is one.

\* \* \* \* \*